United States Patent
Hasegawa

(10) Patent No.: US 8,629,555 B2
(45) Date of Patent: Jan. 14, 2014

(54) FIXTURE FOR SEMICONDUCTOR DEVICE AND ASSEMBLY OF SEMICONDUCTOR DEVICE

(75) Inventor: Tsuyoshi Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 332 days.

(21) Appl. No.: 12/533,494

(22) Filed: Jul. 31, 2009

(65) Prior Publication Data

US 2010/0127391 A1 May 27, 2010

(30) Foreign Application Priority Data

Nov. 21, 2008 (JP) ................. 2008-298541

(51) Int. Cl.
*H01L 23/10* (2006.01)
*H01L 23/34* (2006.01)

(52) U.S. Cl.
USPC ........... 257/718; 257/706; 257/726; 257/727; 257/E23.084

(58) Field of Classification Search
USPC .................. 257/675, 706, 718, 719, E23.084, 257/E23.101, 726, 727; 361/513, 679.43, 361/679.58, 801
See application file for complete search history.

(56) References Cited

U.S. PATENT DOCUMENTS

| | | | | |
|---|---|---|---|---|
| 4,166,665 A | * | 9/1979 | Cutchaw | 439/196 |
| 5,546,275 A | * | 8/1996 | Moutrie et al. | 361/707 |
| 6,379,160 B1 | * | 4/2002 | Loman | 439/79 |
| 6,639,800 B1 | * | 10/2003 | Eyman et al. | 361/704 |
| 6,760,231 B2 | * | 7/2004 | Hung et al. | 361/758 |
| 7,190,586 B2 | * | 3/2007 | Franz et al. | 361/704 |
| 7,333,342 B2 | * | 2/2008 | Saito | 361/719 |
| 2004/0257786 A1 | * | 12/2004 | Murasawa | 361/810 |
| 2006/0169437 A1 | * | 8/2006 | Yano et al. | 165/80.3 |
| 2006/0232938 A1 | * | 10/2006 | Yeh | 361/704 |
| 2008/0191341 A1 | * | 8/2008 | Nishiyama | 257/719 |
| 2008/0286602 A1 | | 11/2008 | Hasegawa | |
| 2009/0008770 A1 | | 1/2009 | Hasegawa | |
| 2009/0039500 A1 | | 2/2009 | Ito et al. | |
| 2009/0072386 A1 | | 3/2009 | Hasegawa | |
| 2009/0091891 A1 | | 4/2009 | Hasegawa | |
| 2009/0284914 A1 | * | 11/2009 | Olesiewicz et al. | 361/679.57 |

FOREIGN PATENT DOCUMENTS

| | | |
|---|---|---|
| JP | 3-41939 | 4/1991 |
| JP | 03082063 A * | 4/1991 |
| JP | 3-59688 | 6/1991 |
| JP | 7-336867 | 12/1995 |

(Continued)

OTHER PUBLICATIONS

U.S. Appl. No. 12/393,680, filed Feb. 26, 2008, Tsuyoshi Hasegawa.

(Continued)

*Primary Examiner* — Teresa M Arroyo
(74) *Attorney, Agent, or Firm* — Oblon, Spivak, McClelland, Maier & Neustadt, L.L.P.

(57) ABSTRACT

A pressing portion of a fixture is put on a lid of a semiconductor package, and anchor portions on the opposite sides of the pressing portion are opposed to a baseplate. Two screw members are passed individually through opening parts formed spanning the pressing portion and anchor portions and threadedly engage with a heat sink through the baseplate. If the screw members are tightened in this state, the anchor portions are pressed by the baseplate, and the pressing portion presses the lid of the semiconductor package, whereby the baseplate is fixed to the heat sink in pressure contact with it.

4 Claims, 10 Drawing Sheets

(56) References Cited

FOREIGN PATENT DOCUMENTS

| | | |
|---|---|---|
| JP | 2002-184919 | 6/2002 |
| JP | 2002-517094 | 6/2002 |
| JP | 2004-288949 | 10/2004 |
| JP | 2006-49466 | 2/2006 |
| JP | 2006049466 A * | 2/2006 |
| WO | WO 2009/110045 A1 | 9/2009 |

OTHER PUBLICATIONS

U.S. Appl. No. 12/579,023, filed Oct. 14, 2009, Takagi, et al.
U.S. Appl. No. 12/667,275, filed Dec. 30, 2009, Hasegawa.
U.S. Appl. No. 12/978,813, filed Dec. 27, 2010, Hasegawa.

* cited by examiner

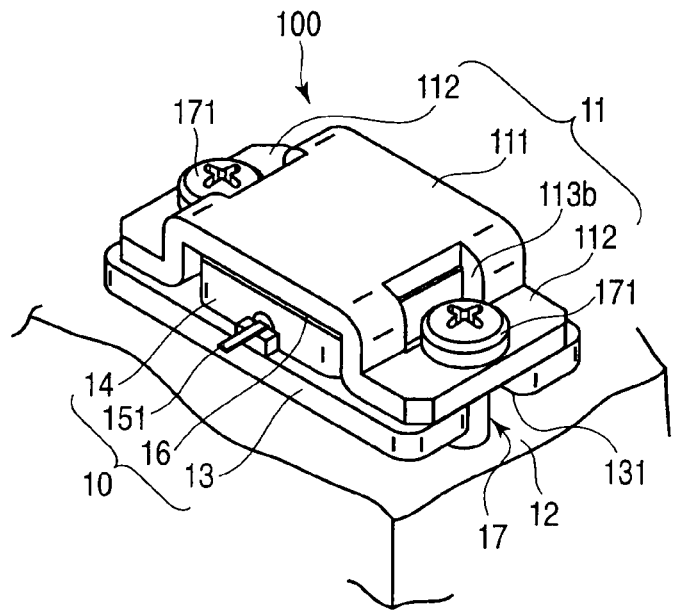
F I G. 1
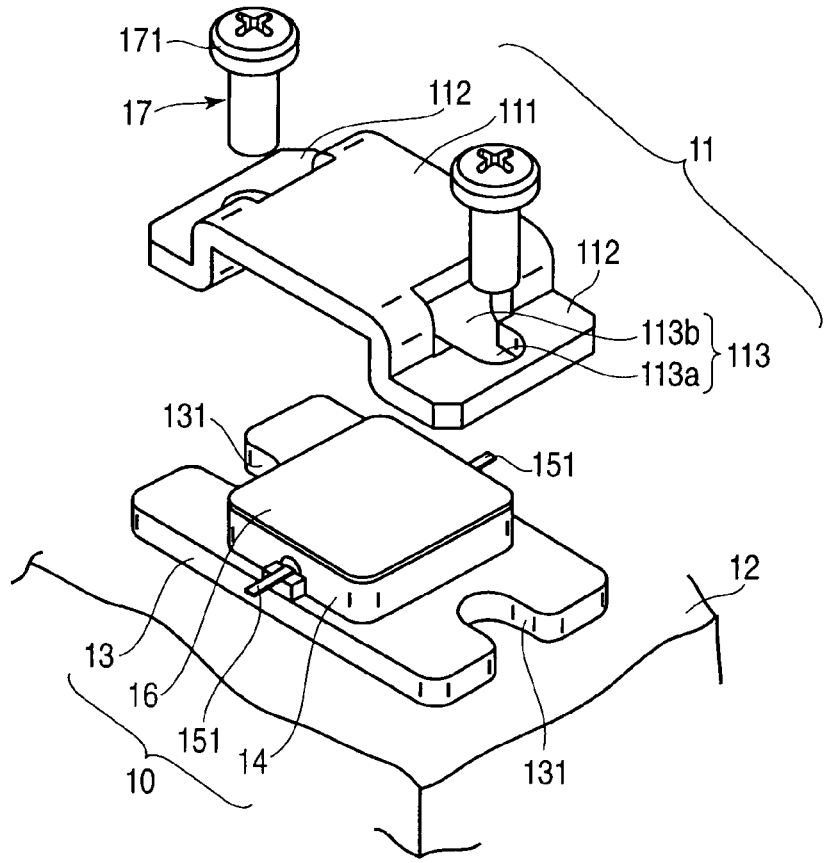
F I G. 2

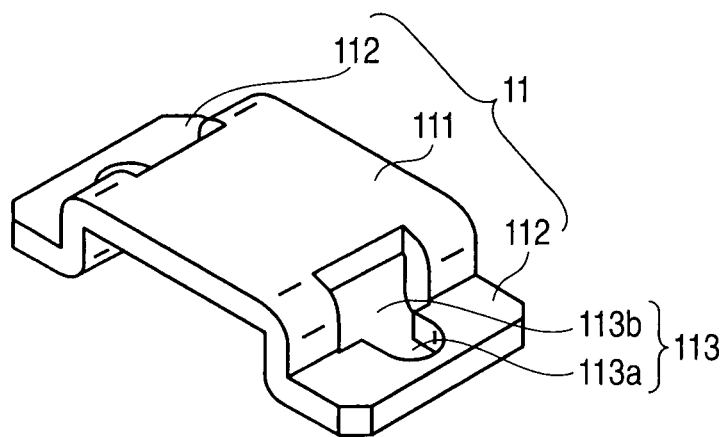
F I G. 4
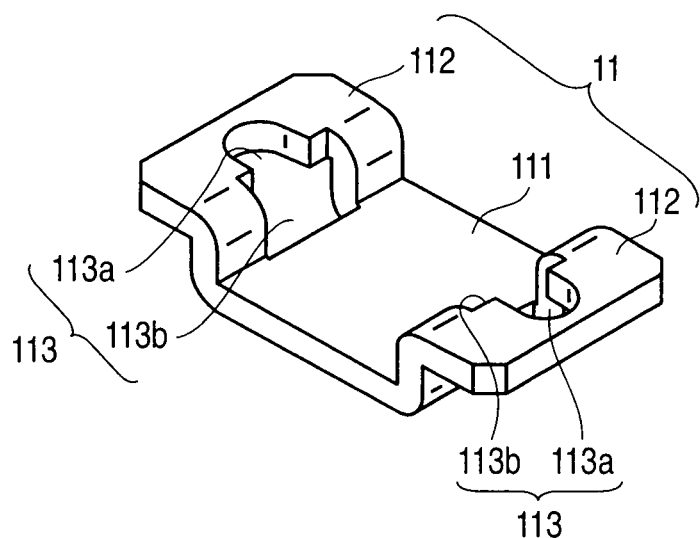
F I G. 5

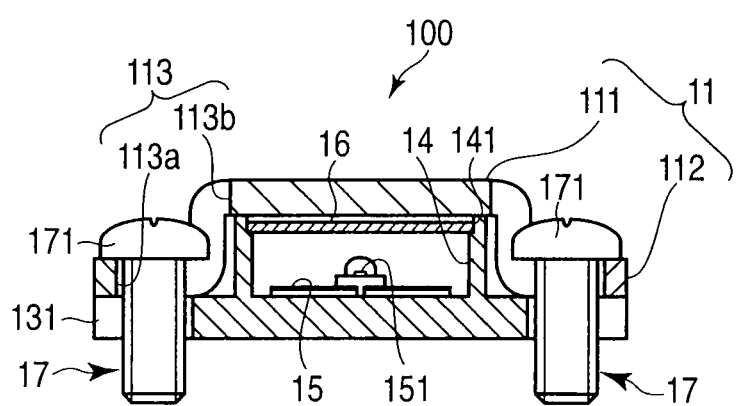
F I G. 12

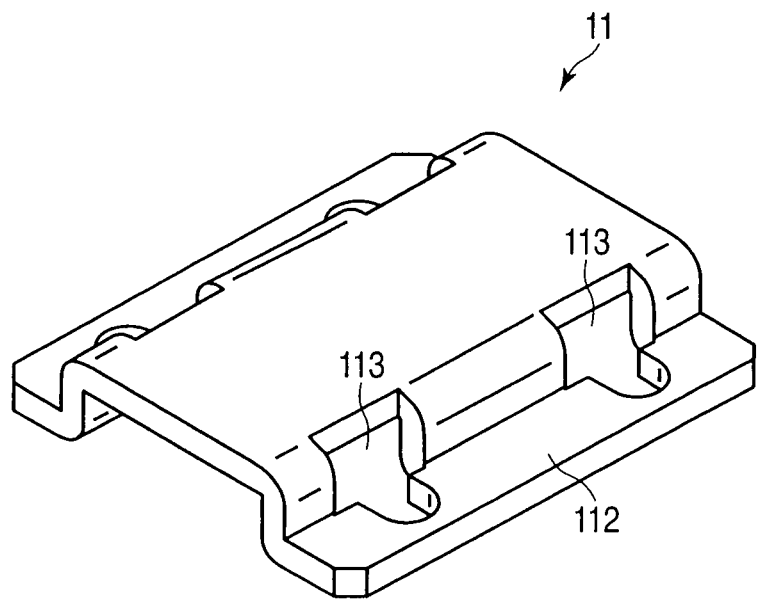
F I G. 13
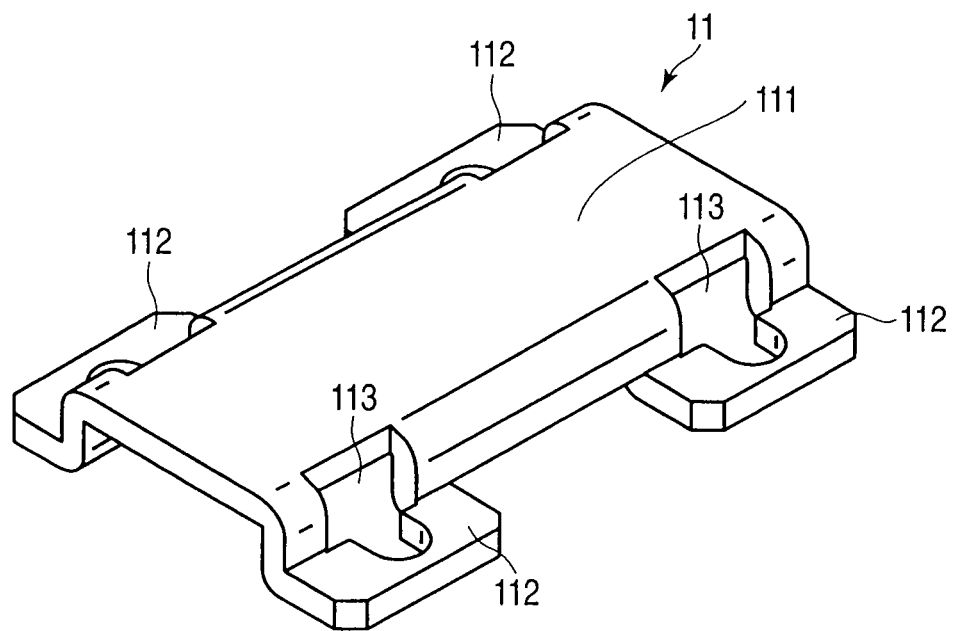
F I G. 14

FIXTURE FOR SEMICONDUCTOR DEVICE AND ASSEMBLY OF SEMICONDUCTOR DEVICE

CROSS-REFERENCE TO RELATED APPLICATIONS

This application is based upon and claims the benefit of priority from prior Japanese Patent Application No. 2008-298541, filed Nov. 21, 2008, the entire contents of which are incorporated herein by reference.

BACKGROUND OF THE INVENTION

1. Field of the Invention

This invention relates to a fixture for fixing a semiconductor device such as a semiconductor package, which contains a semiconductor element, for example, to a radiator such as a heat sink, and an assembly of the semiconductor device.

2. Description of the Related Art

In general, a semiconductor device of this type is configured so that a frame member is mounted on a surface of a baseplate and a semiconductor element is contained within the frame member. Connection terminals for external connection protrude from peripheral walls of the frame member, and a lid is put on that opening of the frame member which is distant from the baseplate, whereby the opening is closed.

The semiconductor device constructed in this manner is used with its connection terminals electrically connected to a circuit of a printed wiring board. During this use, the semiconductor element contained in the semiconductor device is heated, so that the temperature of the device increases. Since the semiconductor device is degraded in performance by the temperature increase, produced heat should be discharged to the outside to keep the temperature at a tolerance level or below.

Accordingly, the semiconductor device is fixed to a radiator by screws through through-holes at four corners of the baseplate. Thus, the heat from the semiconductor device can be transferred to the radiator through the reverse surface of the baseplate, whereupon the semiconductor device is cooled.

If this mounting structure is used, however, it is difficult to bring the entire reverse surface of the baseplate uniformly into contact with the radiator. If the baseplate is warped, for example, the thermal contact resistance increases in a region other than its four corners, near the center in which the frame member is mounted. This thermal contact resistance can be made uniform by enhancing the manufacturing accuracy of the baseplate including the amount of warp. If this is done, however, machining the baseplate is very troublesome and entails high costs.

On the other hand, Jpn. UM Appln. KOKAI Publication No. 3-59688 (Patent Document 1) discloses a technique such that a wall surface of a semiconductor element is brought into pressure contact with a radiator plate by means of, for example, an L-shaped metal fitting, whereby the thermal contact resistance between the wall surface and plate is reduced. The L-shaped metal fitting of Patent Document 1 has its one end passed through a hole in a backing and the other end in contact with the wall surface of the semiconductor element. The metal fitting is fastened to the base member by screws that are passed through threaded holes between a bent portion and the other end.

Also disclosed in Jpn. Pat. Appln. KOKAI Publication No. 2004-288949 (Patent Document 2) is a structure in which a baseplate of a semiconductor device is fixed to a radiator under pressure with a graphite sheet with high thermal conductivity between them. By using this mounting structure, the manufacturing accuracy of the baseplate and the thermal contact resistance can be reduced without enhancing the flatness of the baseplate surface.

Alternatively, a structure may be provided such that grease for heat radiation is applied in place of the graphite sheet between the baseplate and radiator.

In the mounting structure disclosed in Patent Document 1, however, the semiconductor device is pressed against the radiator by means of the L-shaped cantilevered metal fitting. Therefore, it is difficult to uniformly press the wall surface of the semiconductor element against the radiator plate, so that the thermal contact resistance cannot be sufficiently reduced. If this mounting structure is used, moreover, the semiconductor element and L-shaped metal fitting must be held down by hand as they are fastened, so that the mounting operation is laborious. If this structure is used, furthermore, the installation area of the semiconductor element including the L-shaped metal fitting becomes greater than a thermal contact area between the semiconductor element and radiator plate, so that the mounting layout is restricted to that extent, and the device configuration is inevitably enlarged.

In the mounting structure disclosed in Patent Document 2, on the other hand, the thermal contact resistance between the semiconductor device and radiator can be made lower than in the case of Patent Document 1. Since the graphite sheet or grease for heat radiation is interposed between the device and radiator, however, the electrical resistance is higher to that extent. Thus, it is hard to use the package itself of the semiconductor device as an electrode.

If the mounting structure of Patent Document 2 is used, moreover, so many components are required that the assembly and manufacture are troublesome and the product costs are high.

BRIEF SUMMARY OF THE INVENTION

A fixture for a semiconductor device according to an aspect of the invention is configured to thermally connect and fix a semiconductor device, in which a frame member containing a semiconductor element and covered by a lid is disposed on a mounting base, to a radiator. The fixture comprises a pressing portion put on the lid so as to be in engagement with the lid or the frame member, anchor portions extending individually from opposite ends of the pressing portion, bent toward the mounting base, and closely opposed to the mounting base, and fastening opening parts provided spanning the pressing portion and the anchor portions.

Further, an assembly of a semiconductor device according to another aspect of the invention comprises a semiconductor device in which a frame member containing a semiconductor element and covered by a lid is disposed on a mounting base, a fixture including a pressing portion put on the lid so as to be in engagement with the lid or the frame member, anchor portions extending individually from opposite ends of the pressing portion, bent toward the mounting base, and closely opposed to the mounting base, and fastening opening parts provided spanning the pressing portion and the anchor portions, and fasteners passed individually through the opening parts and configured to fasten the anchor portions and the mounting base to the radiator.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view showing an assembly according to a first embodiment;

FIG. 2 is an exploded perspective view of the assembly of FIG. 1;

FIG. 4 is a perspective view showing a fixture of FIG. 1;

FIG. 5 is a perspective view of the fixture of FIG. 1 taken diagonally from inside;

FIG. 12 is a sectional view showing an assembly according to a fourth embodiment;

FIG. 13 is a perspective view showing a fixture according to a fifth embodiment;

FIG. 14 is a perspective view showing a fixture according to a sixth embodiment;

DETAILED DESCRIPTION OF THE INVENTION

Embodiments will now be described in detail with reference to the accompanying drawings.

FIG. 1 is a perspective view showing an assembly 100 of a semiconductor device according to a first embodiment. FIG. 2 is an exploded perspective view of the assembly 100 of FIG. 1. A semiconductor package (semiconductor device) 10 is fastened to a surface of a heat sink (radiator) 12 by a fixture 11 and two screw members (fasteners) 17. In the state shown in FIG. 1, the semiconductor package 10 is connected thermally and electrically to the heat sink 12.

Figure 3A:
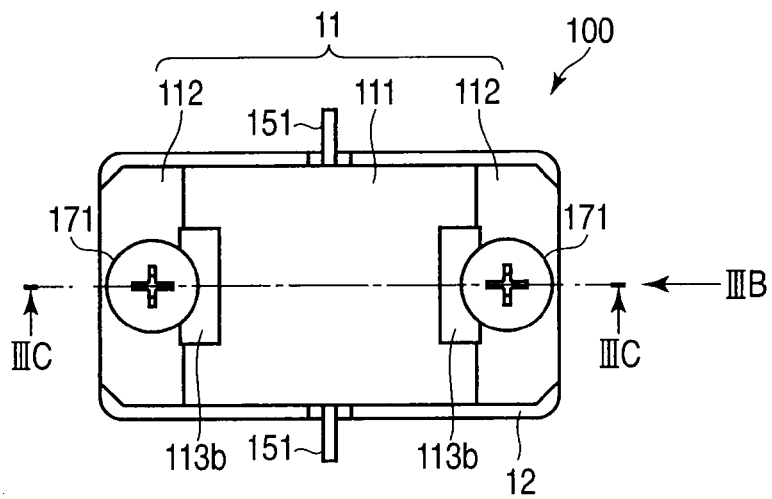
FIG. 3A is a plan view of the assembly of FIG. 1 taken from its obverse side.
Figure 3B:
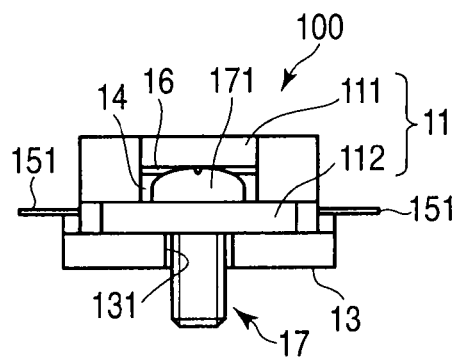
FIG. 3B is a side view of the assembly taken in the direction of arrow 111B in FIG. 3A.
Figure 3C:
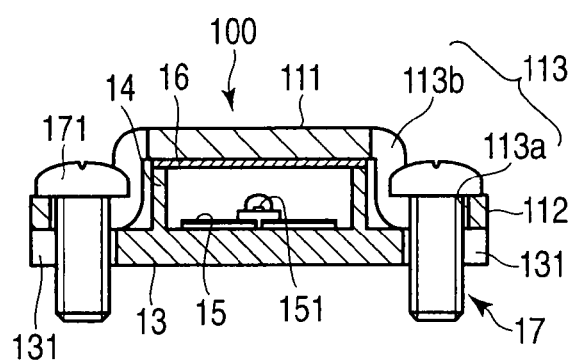
FIG. 3C is a sectional view of the assembly taken along line IIIC-IIIC of FIG. 3A.

As shown in FIGS. 3A to 3C, the semiconductor package 10 includes a baseplate (mounting base) 13, frame member 14, and lid 16. FIG. 3A is a plan view of the assembly 100 of FIG. 1 taken from its obverse side, FIG. 3B is a side view of the assembly 100 taken in the direction of arrow 111B in FIG. 3A, and FIG. 3C is a sectional view of the assembly 100 taken along line IIIC-IIIC of FIG. 3A.

The baseplate 13 is a substantially rectangular plate of a metallic material with high thermal conductivity, such as a copper alloy, and has mounting notches 131 near its longitudinally opposite ends. The frame member 14 is a substantially rectangular frame that surrounds an element containing section and protrudes integrally from that surface part of the baseplate 13 between the two mounting notches 131. Although the frame member 14 is formed integrally with the baseplate 13 in the present embodiment, these two members may be formed separately so that they can be joined together in a post-processing step.

As shown in FIG. 3C, the semiconductor element 15 is contained within the frame member 14 and mounted on the surface of the baseplate 13. As shown in FIG. 2, external connection terminals 151 electrically connected to the semiconductor element 15 protrude individually from those two sidewalls of the frame member 14 which are not opposed to the two mounting notches 131. The lid 16, e.g., a substantially rectangular metal plate, is put on that opening of the frame member 14 which is distant from the baseplate 13, whereby the opening is closed.

As shown in FIGS. 4 and 5, the fixture 11 is a structure with a heat-shaped cross-section formed of, for example, a relatively rigid metallic material with high thermal conductivity. Specifically, the fixture 11 is formed by shaping or bending a substantially rectangular metal plate a plurality of times, and includes a pressing portion 111 in the center and two anchor portions 112 on the longitudinally opposite sides.

The inner surface of the pressing portion 111 presses the lid 16 of the semiconductor package 10 with the fixture 11 fastened to the heat sink 12 (e.g., in the state shown in FIG. 1). Thus, the pressing portion 111 is formed to be one size larger than the lid 16 so that it can be mounted covering the lid 16. In this state, the two anchor portions 112 are opposed to the surface of the baseplate 13 outside the frame member 14. More accurately, a pressing force (mentioned later) is produced against the semiconductor package 10, so that the two anchor portions 112 cannot contact the surface of the baseplate 13 if the fixture 11 is only put on the package 10.

Further, the fixture 11 has relatively large opening parts 113, which span the pressing portion 111 and the two anchor portions 112 on the opposite sides. Each of these two opening parts 113 is formed with an insertion port 113a and an open port 113b connected to each other. Each insertion port 113a is opposed to its corresponding mounting notch 131 when the pressing portion 111 is put on the lid 16 of the semiconductor package 10 so that the anchor portions 112 are opposed to the baseplate 13. Further, a wall portion of the frame member 14 is exposed outward through each open port 113b with the fixture 11 fitted thereon.

In fastening the semiconductor package 10 to the surface of the heat sink 12 by means of the fixture 11 constructed in this manner, the fixture 11 is first put on the package 10 so that the screw members 17 are passed individually through the respective insertion ports 113a of the two opening parts 113. Then, the respective leg positions of the two screw members 17 are passed individually through the two mounting notches 131 of the baseplate 13 and further caused to threadedly engage with threaded holes (not shown) in the heat sink 12.

If the screw members 17 are tightened in this state, the anchor portions 112 of the fixture 11 are pressed toward the baseplate 13, and the pressing portion 111 presses the lid 16 of the semiconductor package 10. Thereupon, the longitudinally opposite ends of the baseplate 13 are pressed directly against the heat sink 12 by the screw members 17, a nearly central part of the baseplate 13 is pressed by the pressing portion 111 with the lid 16 and frame member 14 between them, and the entire reverse surface of the baseplate 13 can uniformly be brought into pressure contact with the surface of the heat sink 12. Thus, the assembly 100 is constructed including the semiconductor package 10 fixed to the heat sink 12.

According to the present embodiment, the fixture 11 has the two relatively large opening parts 113, so that the two screw members 17 can be mounted so that they are located close to each other or that their respective leg portions pass individually through positions near sidewalls of the frame member 14. Thus, according to the present embodiment, a fastening force of the two screw members 17 acts on the semiconductor package 10 in the vicinity of the frame member 14, so that the nearly central part of the baseplate 13 can be effectively pressed against the heat sink 12, whereby the thermal contact resistance between the baseplate 13 and heat sink 12 can be reduced.

If the relatively large opening parts 113, especially the open ports 113b through which the sidewalls of the frame member 14 are exposed, are not provided, on the other hand, respective heads 171 of the screw members 17, which are larger in diameter than the leg portions, interfere with the fixture 11. Therefore, the screw members 17 cannot be mounted close to each other, that is, to the frame member 14. Since the open ports 113b are formed in the fixture 11 in the present embodiment, the heads 171 of the screw members 17 can be prevented from interfering with the fixture 11. Each of the two screw members 17 can be brought to its corresponding sidewall of the frame member 14 by a margin equivalent to the thickness of the fixture 11, and the nearly central part of the baseplate 13, on which the semiconductor element 15 is mounted, can be securely pressed against the heat sink 12.

In the present embodiment, the relatively large opening parts 113 are formed penetrating the fixture 11 in order to mount the screw members 17 close to each other. However, through-holes are not essentially required, and it is necessary only that the fixture 11 be shaped so as not to interfere with the heads 171 of the screw members 17. If recesses to receive the heads 171 are formed in, for example, those regions of the fixture 11 which interfere with the screw members 17 (or heads 171), at least the two screw members 17 can be brought closer to each other than in the case where no refuge means is provided. It is most effective, however, to provide the open ports 113b, since they allow the screw members 17 to be brought closest to the frame member 14.

In the present embodiment, moreover, only the two opening parts 113 are formed in the fixture 11. Alternatively, however, through-holes or notches may be formed to reduce the weight of the fixture 11 and parts cost. Preferably, in this case, the through-holes or notches should be formed in those positions which do not include an annular region of the fixture 11 that presses the frame member 14 and where the mechanical strength of the fixture 11 cannot be impaired. Thus, in order to reduce the thermal contact resistance by uniformly pressing the semiconductor package 10 against the heat sink 12, it is effective to press the baseplate 13 through the frame member 14.

Figure 6:
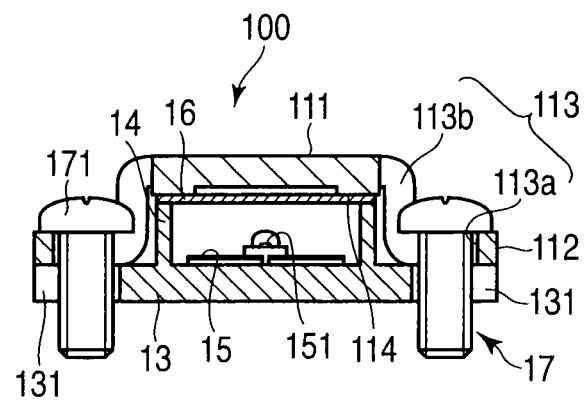
FIG. 6 is a sectional view showing an assembly according to a second embodiment.
Figure 7:
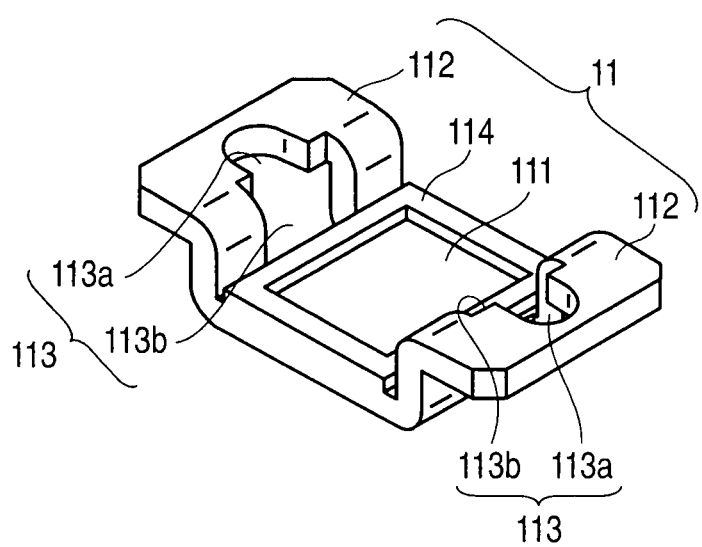
FIG. 7 is a perspective view of a fixture of the assembly of FIG. 6 taken diagonally from inside.

FIG. 6 is a sectional view showing an assembly 100 according to a second embodiment. Further, FIG. 7 is a perspective view of a fixture of the assembly 100 of FIG. 6, that is, a fixture 11 according to the second embodiment, taken from inside. FIGS. 6 and 7 correspond to FIGS. 3C and 5, respectively, showing the first embodiment. Like numbers are used to designate those elements of the first and second embodiments which have the same functions throughout the several views, and a detailed description thereof is omitted.

In the fixture 11 of the present embodiment, a pressing projection 114 in the shape of a rectangular ring protrudes integrally from the inner surface of a pressing portion 111 opposed to a lid 16 of a semiconductor package 10. As shown in FIG. 6, the pressing projection 114 is disposed in a position where it presses the upper end of a frame member 14 with the fixture 11 on the semiconductor package 10. Although the pressing projection 114 is formed integrally with the pressing portion 111 in the present embodiment, these two parts may be formed separately so that they can be joined together in a post-processing step.

If the semiconductor package 10 is fixed to a heat sink 12 by using the fixture 11 of the present embodiment, the pressing projection 114 presses the package through the frame member 14. As in the first embodiment, therefore, a nearly central part of a baseplate 13 can be effectively pressed against the heat sink 12. According to present embodiment, in particular, the pressing projection 114 prevents the pressing portion 111 of the fixture 11 from contacting the lid 16 of the semiconductor package 10, so that a pressing force produced by the fixture 11 does not act on an undesired region (e.g., nearly central part) of the lid 16 in vain.

The semiconductor package 10 fixed to the heat sink 12, as in the first and second embodiments, is finally enabled to operate when external connection terminals 151 protruding from wall surfaces of the frame member 14 are electrically connected to connection ends of a printed wiring board (not shown). In the semiconductor package 10 fixed by means of the fixture 11 described above, the baseplate 13 is mounted in direct contact with the surface of the heat sink 12, so the package itself can also function as an electrode.

Thus, according to the first and second embodiments described above, the baseplate 13 of the semiconductor package 10 can be thermally connected to the surface of the heat sink 12 with a small thermal contact resistance. In addition, the baseplate 13 and heat sink 12 can be electrically connected to each other for electrical conduction. Thus, the heated semiconductor package 10 can be effectively cooled and used as an electrode itself.

According to the foregoing embodiments, in particular, the two screw members 17 are mounted close to the frame member 14 of the semiconductor package 10, so that the anchor portions 112 near the frame member 14 can be pressed by the heads 171 of the screw members 17. If the semiconductor package 10 is fixed by means of the fixture 11 of each of the foregoing embodiments, the thermal contact resistance between the baseplate 13 and heat sink 12 can be extremely reduced, so that the cooling effect of the package 10 can be enhanced. In a process for manufacturing the semiconductor package 10, moreover, the machining accuracy of the surface of the baseplate 13 can be lowered to reduce the manufacturing costs.

According to the embodiments described above, furthermore, the thermal contact resistance between the baseplate 13 and heat sink 12 can be reduced without using any other component, such as a conventional graphite sheet or grease for heat radiation. Accordingly, the device configuration can be simplified, and the number of components can be reduced. Moreover, the number of assembly steps for the assembly can be reduced, so that the operation load can be lightened, and the assembly manufacturing costs can be reduced. Thus, the usage can be diversified.

According to the embodiments described above, furthermore, the fixture 11 can be easily applied to a conventional semiconductor package without failing to reduce its thermal contact resistance.

Figure 8:
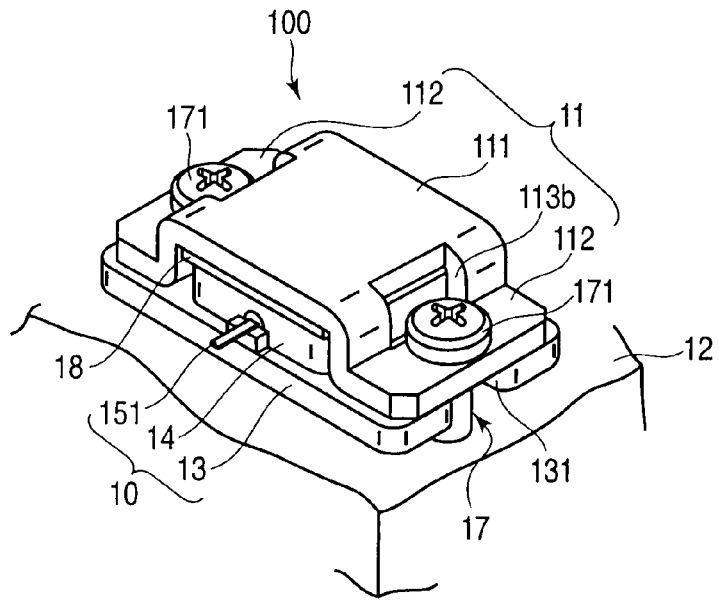
FIG. 8 is a perspective view showing an assembly according to a third embodiment.
Figure 9:
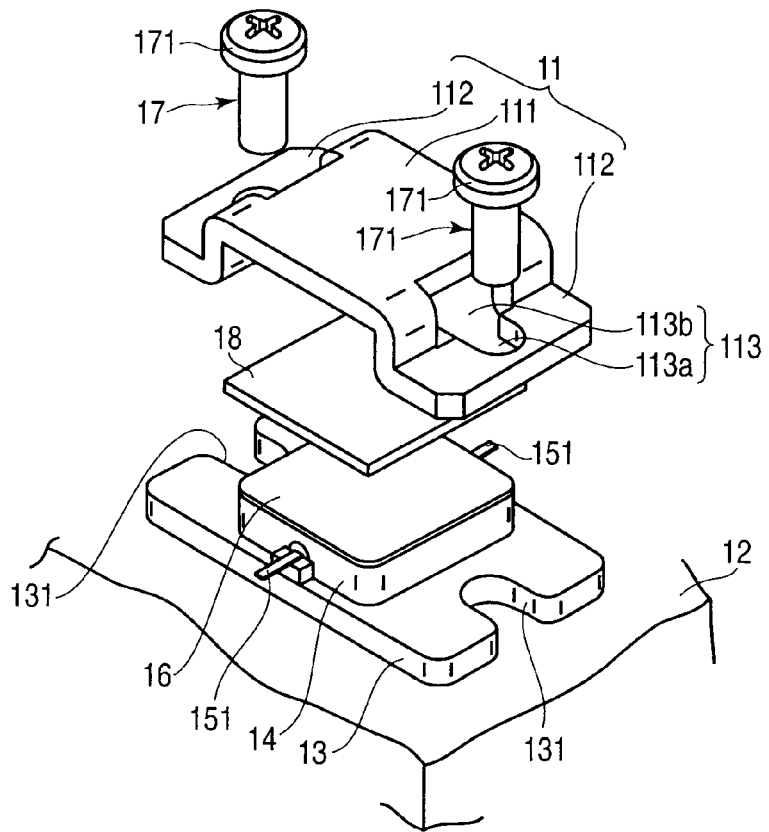
FIG. 9 is an exploded perspective view of the assembly of FIG. 8.
Figure 10A:
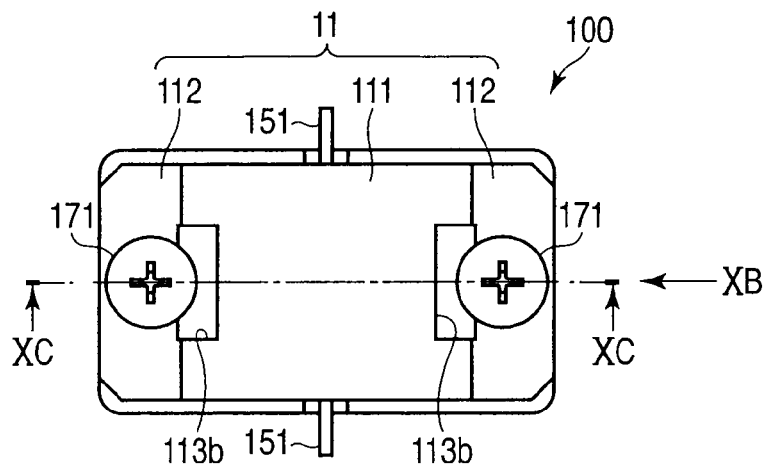
FIG. 10A is a plan view of the assembly of FIG. 8 taken from its obverse side.
Figure 10B:
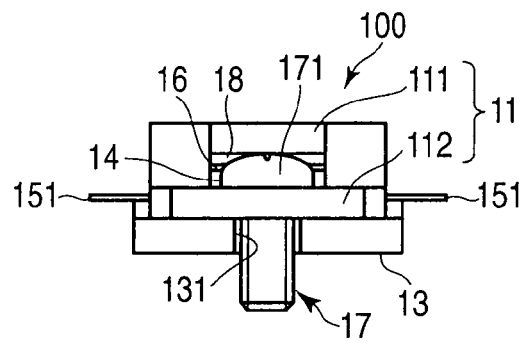
FIG. 10B is a side view of the assembly taken in the direction of arrow XB in FIG. 10A.
Figure 10C:
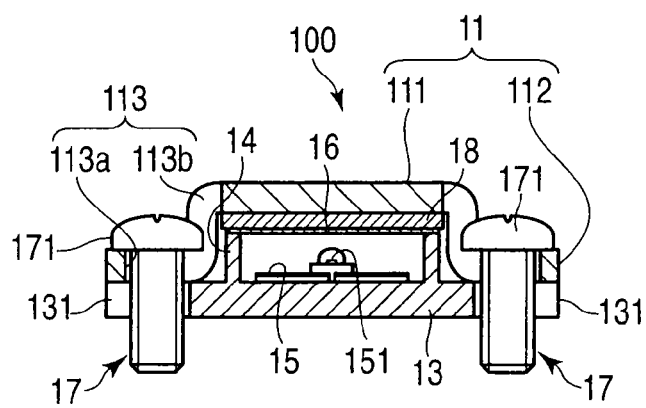
FIG. 10C is a sectional view of the assembly taken along line XC-XC of FIG. 10A.

FIG. 8 is a perspective view showing an assembly 100 according to a third embodiment. Further, FIG. 9 is an exploded perspective view of the assembly 100 of FIG. 8. FIG. 10A is a plan view of the assembly 100 of FIG. 8 taken from its obverse side, FIG. 10B is a side view of the assembly 100 of FIG. 10A taken in the direction of arrow XB in FIG. 10A, and FIG. 10C is a sectional view of the assembly 100 of FIG. 10A taken along line XC-XC of FIG. 10A. FIGS. 8, 9 and 10A to 10C correspond to FIGS. 1, 2 and 3A to 3C, respectively, showing the first embodiment. Like numbers are used to designate those elements of the first and third embodiments which have the same functions, and a detailed description thereof is omitted.

The assembly 100 of the present embodiment includes a sheet-like cushion 18 of, for example, silicone rubber between a lid 16 of a semiconductor package 10 and a pressing portion 111 of a fixture 11. Other configurations of this assembly are substantially the same as those of the assembly 100 of the foregoing first embodiment. The cushion 18 serves as an elastic member, which makes uniform a pressing force applied to the lid 16 through the pressing portion 111. Thereupon, the pressing force produced as the pressing portion 111 is clamped uniformly acts on the entire surface of the lid 16. Thus, the entire lid 16 can be pressed with a uniform force, so that the baseplate 13 can be evenly pressed toward the heat sink 12.

According to the present embodiment, moreover, the elasticity of the cushion 18 can be varied by changing its thickness or material. According to the present embodiment, furthermore, the fixture 11 can be generally applied to various types of semiconductor packages 10 of different heights by changing the thickness of the cushion 18.

Although the substantially rectangular, sheet-like cushion 18 is used in the present embodiment, it should preferably be shaped like a frame similar to the pressing projection 114 of the second embodiment. In this case, a pressing force can be effectively applied to the upper end of the frame member 14 through the frame-like cushion 18, so that the same effects as those of the second embodiment can be expected.

Figure 11:
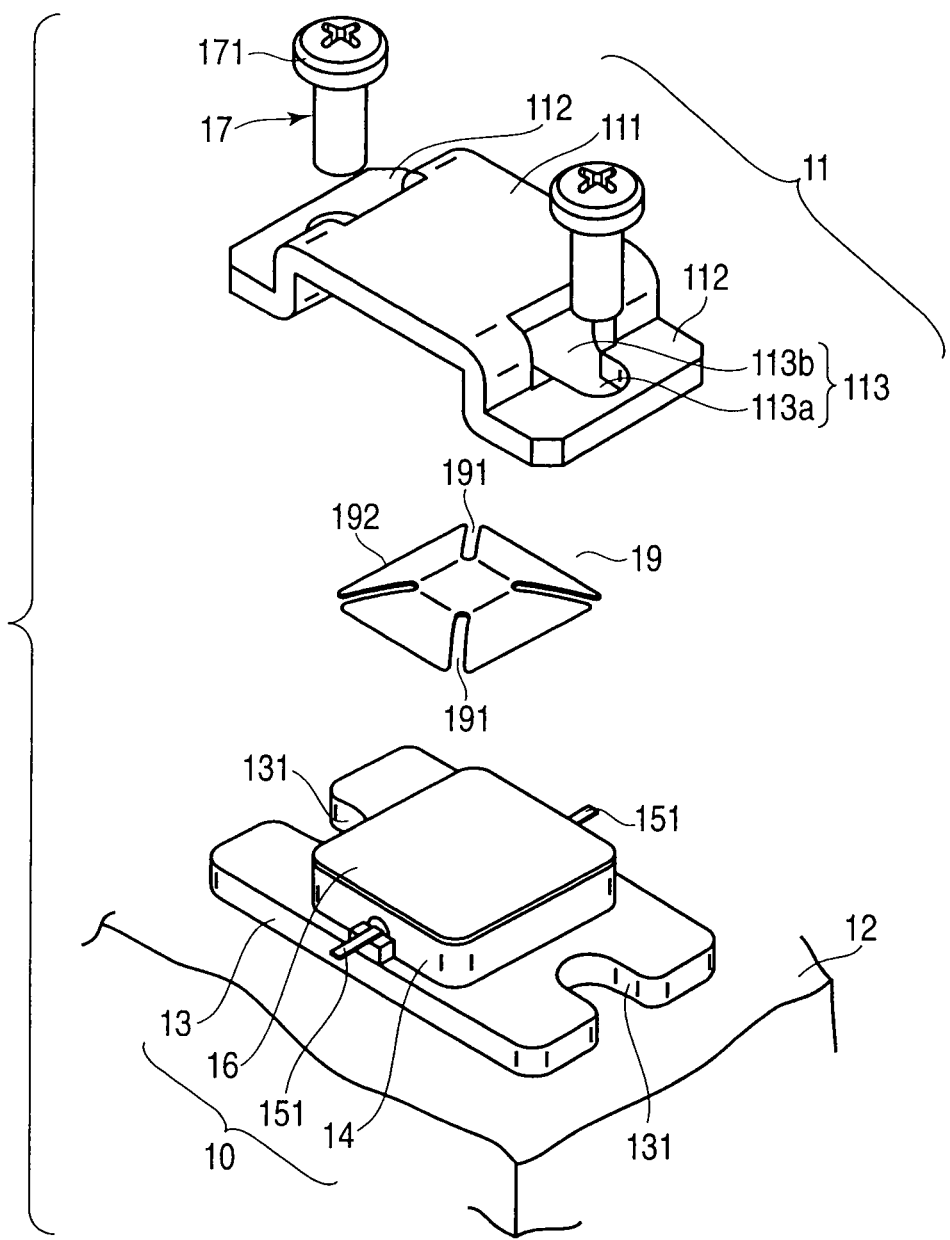
FIG. 11 is an exploded perspective view showing a modification of the assembly of FIG. 8.

Further, the cushion 18 for use as an elastic member may be replaced with a leaf spring 19 (spring member), such as the one shown in FIG. 11. The leaf spring 19 has four slits 191, which individually extend halfway from four corner portions of a substantially rectangular metal plate toward its center, and is slightly curved so that its central part is convex. Furthermore, four end sides 192 of the leaf spring 19 are cut diagonally (not shown) so that they can be in planar contact with the surface of the lid 16 when the spring 19 is placed on the lid 16 in a posture (illustrated posture) such that it is upwardly convex.

If the leaf spring 19 is formed to have substantially the same size as the lid 16 of the semiconductor package 10, its four end sides are opposed to a frame-like end portion of the frame member 14, and the pressing force from the pressing portion 111 applied to the lid 16 through the leaf spring 19 acts on the frame member 14. Thus, the same effects as those of the second and third embodiments can be obtained.

FIG. 12 is a sectional view showing an assembly 100 according to a fourth embodiment. This sectional view corresponds to FIG. 3C showing the first embodiment. The assembly 100 of the present embodiment has the same construction as that of the first embodiment except for the mounting structure of a lid 16 of a semiconductor package 10. Therefore, like numbers are used to designate those elements of the first and fourth embodiments which have the same functions, and a detailed description thereof is omitted.

The semiconductor package 10 of the present embodiment includes a stepped portion 141 on the inner periphery of a rectangular opening of a frame member 14, and a lid 16 that is one size smaller than the stepped portion 141 is fitted in the stepped portion. When a fixture 11 is put on the semiconductor package 10 as illustrated, therefore, the inner surface of a pressing portion 111 contacts an end portion of the frame member 14, not the lid 16.

Thus, a pressing force applied from the pressing portion 111 of the fixture 11 acts on the frame member 14 only, so that the frame member 14 is directly pushed to press a baseplate 13 against a heat sink 12.

In each of the embodiments described above, moreover, the fixture 11 used is made of a highly rigid metal. Alternatively, however, the pressing portion 111 of the fixture 11 may, for example, be formed of an elastic material so that it is elastically deformable. Thus, the frame member 14 and lid 16 of the semiconductor package 10 can be uniformly pressed by means of the elasticity of the pressing portion 111, whereby the thermal contact resistance between the package 10 and heat sink 12 can be reduced.

This invention is not limited to the embodiments described above, and may be carried out in various modified forms without departing from the scope or spirit of the invention. Further, the foregoing embodiments include inventions in various stages, so that various inventions can be extracted by appropriately combining a plurality of constituent elements disclosed in the embodiments.

If the problem to be solved by the invention can be solved to obtain the effect of the invention even though some of the constituent elements of the embodiments are removed, for example, resulting configurations removed of these elements can be extracted as inventions.

In each of the embodiments described above, for example, the screw members 17 passed through the opening parts 113 of fixture 11 are simply brought close to the frame member 14. Alternatively, however, the screw members 17 may be brought into contact with the stepped portion 14. In this case, an effect, though small, can be expected to transfer heat from the semiconductor package 10 to the heat sink 12 through the two screw members 17.

In each of the embodiments described herein, moreover, the two screw members 17 are used as fasteners for fastening the fixture 11. Alternatively, however, any other fasteners may be used provided that they can clamp the fixture 11 so as to bring it close to the heat sink 12.

The shape of the fixture 11 is not limited to the shape described in relation to each of the embodiments described above, and may be any one of the fifth to eighth embodiments shown in FIGS. 13-16. For example, the number of anchor portions 112 and the number of opening parts 113 may be determined in an arbitrary manner. A description will be given of the fifth to eighth embodiments. In the description below, like numbers are used to designate those elements of the foregoing embodiments as in the descriptions of the foregoing embodiments, and a detailed description of such elements will be omitted.

The fixture 11 of the fifth embodiment shown in FIG. 13 differs from the fixture 11 of the foregoing embodiments in that each of two anchor portions 112 has two opening parts 113.

The fixture 11 of the sixth embodiment shown in FIG. 14 differs from the fixture 11 of the fifth embodiment in that each of two anchor portions 112 is divided into halves and the pressing portion 111 is expanded in such a direction as to separate the halves of the anchor portion 112 from each other. As can be seen from this, the fixture 11 of the sixth embodiment comprises four anchor portions 112.

Figure 15:
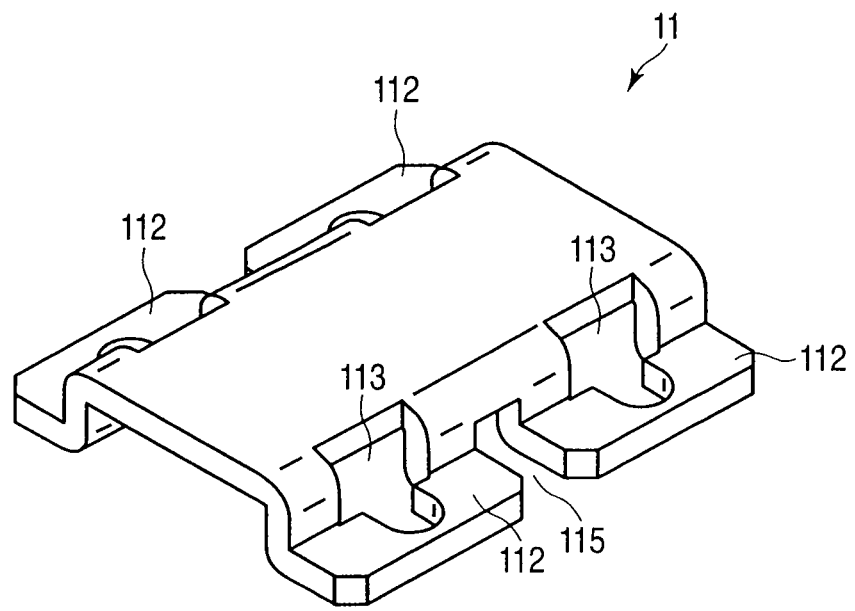
FIG. 15 is a perspective view showing a fixture according to a seventh embodiment.

The fixture 11 of the seventh embodiment shown in FIG. 15 differs from the fixture 11 of the fifth embodiment in that each of two anchor portions 112 is divided into halves by providing a notch 115.

Figure 16:
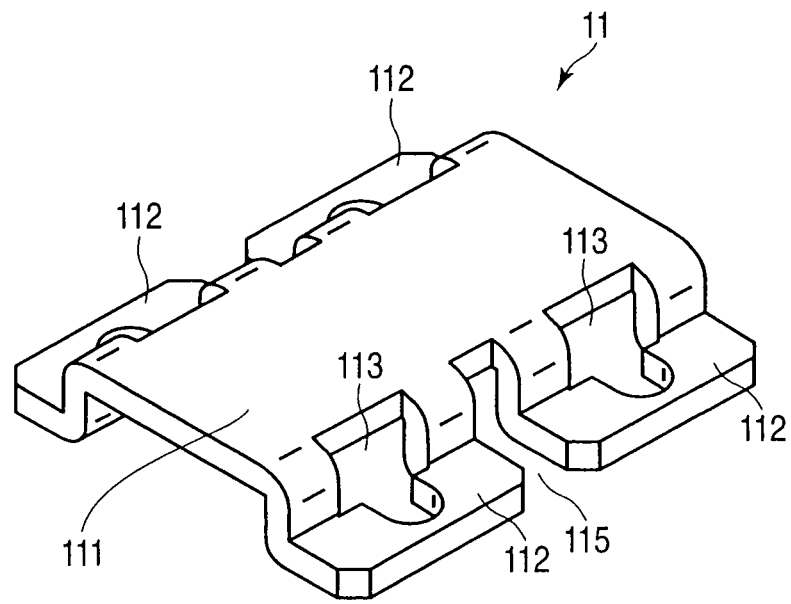
FIG. 16 is a perspective view showing a fixture according to a eighth embodiment.

The fixture 11 of the eighth embodiment shown in FIG. 16 differs from the fixture 11 of the seventh embodiment in that the notch 115 is extended up to the pressing portion 111.

What is claimed is:

1. A fixture for a semiconductor device, configured to thermally connect and fix the semiconductor device, in which a frame member containing a semiconductor element and covered by a lid is disposed on a mounting base, to a radiator, the fixture comprising:

a pressing portion put on the lid so as to be in engagement with the lid or the frame member and having opposite ends;

anchor portions extending individually from the opposite ends of the pressing portion, bent toward the mounting base, and closely opposed to the mounting base; and opening parts provided in the anchor portions and having portions extending to the pressing portion from the anchor portions, the opening parts provided in the anchor portions being configured to receive fasteners to fix the anchor portions on the radiator, the opening parts provided in the anchor portions being located on the anchor portions such that, due to the portions thereof that extend to the pressing portion, major diameters of the fasteners received therein do not interfere with the pressing portion of the fixture, the opening parts being located on the anchor portions such that the major diameters of the fasteners would interfere with the pressing portion of the fixture in the absence of the portions thereof that extend to the pressing portion.

2. A fixture for a semiconductor device according to claim 1, further comprising the fasteners passed individually through the opening parts and fastening the anchor portions and the mounting base to the radiator.

3. A fixture for a semiconductor device according to claim 2, wherein the fasteners are passed individually through the opening parts so that respective proximal end portions of the fasteners are anchored to the anchor portions and that respective distal end portions of the fasteners are passed through the mounting base and fixed to the radiator, with the anchor portions fixed to the radiator in pressure contact therewith.

4. A fixture for a semiconductor device according to claim 3, wherein the fasteners are screw members having heads, and the diameters of the heads are the major diameters.

* * * * *